United States Patent [19]

Cavallotti et al.

[11] Patent Number: 5,783,059
[45] Date of Patent: Jul. 21, 1998

[54] ELECTRODEPOSITION BATH

[75] Inventors: Pietro Luigi Cavallotti; Vittorio Sirtori, both of Milan, Italy; Giovanni Zangari, Pittsburgh, Pa.

[73] Assignee: International Business Machines Corporation, Armonk, N.Y.

[21] Appl. No.: 837,860

[22] Filed: Apr. 22, 1997

[30] Foreign Application Priority Data

Apr. 26, 1996 [GB] United Kingdom ............... 9608665

[51] Int. Cl.$^6$ ..................................................... C25D 5/50
[52] U.S. Cl. ........................... 205/226; 205/252; 205/253
[58] Field of Search ................................. 205/252, 253, 205/254, 225, 226

[56] References Cited

U.S. PATENT DOCUMENTS

| | | | |
|---|---|---|---|
| 5,039,576 | 8/1991 | Wilson | 428/626 |
| 5,200,057 | 4/1993 | Canaris | 205/245 |
| 5,368,814 | 11/1994 | Gonya et al. | 420/587 |
| 5,688,493 | 11/1997 | Sugawara et al. | 424/61 |
| 5,698,087 | 12/1997 | Bokisa | 205/254 |

FOREIGN PATENT DOCUMENTS

| | | |
|---|---|---|
| 5300503 4A | 1/1978 | Japan . |
| 1191492A | 11/1985 | U.S.S.R. . |

OTHER PUBLICATIONS

Surf & Coat Tech. vol. 27, pp. 151–166 (1986) Y.N. Sadana, R. N. Gedye and S. Ali Electrodeposition of Alloys (no month available).

*Primary Examiner*—Kathryn L. Gorgos
*Assistant Examiner*—Kishor Mayekar
*Attorney, Agent, or Firm*—John R. Pivnichny

[57] ABSTRACT

An electrodeposition bath for depositing a Sn alloy onto a Cu substrate containing a Zn salt. This bath is particularly useful for Pb free alloy, such as a Sn—Bi alloy. The presence of Zn in the elctrodeposition bath greatly influence the bath behaviour and the characteristics of the deposited alloy, even if no Zn is codeposited on the Cu substrate.

13 Claims, 1 Drawing Sheet

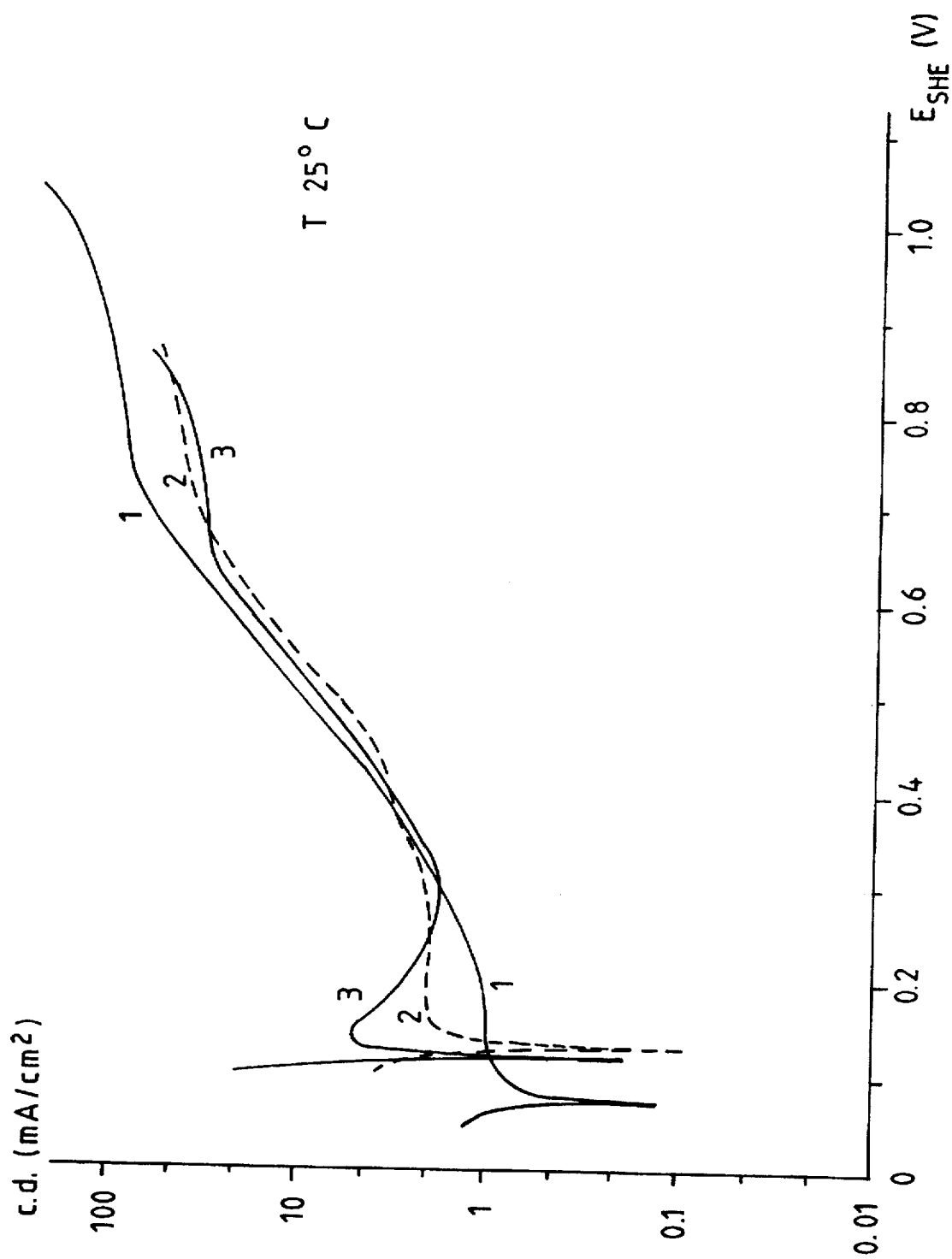

ELECTRODEPOSITION BATH

TECHNICAL FIELD

The present invention relates to an electrodeposition bath; more particularly to a bath for electrodepositing a tin (Sn) based alloy.

BACKGROUND OF THE INVENTION

The use of tin based solder alloys is common in electronic applications, particularly in the manufacturing of printed circuit boards (PCB), for assembly of components onto the boards, providing mechanical and electrical connection. These tin solder alloys are useful in joining integrated circuit chips to chip carriers and substrates, joining chip carriers to substrates, and joining circuitization lands and pads in multilayer printed circuit boards.

In the manufacturing of a microelectronic package, it is common practice to attach a component onto a printed circuit board or the like, for example by surface mounting utilizing a solder connection. For this purpose, the board features a circuit trace including a pad that constitutes a first surface for the connection; similarly, the component includes a second surface, for example a contact.

The interconnection method comprises the steps of applying a solder alloy on the Cu substrate, typically onto the pad included in the printed circuit board.

The electronic components to be joined with the board are then brought into contact with the solder layer. The solder alloy is heated to cause the solder alloy to melt and reflow; heating may be by vapor phase reflow, infrared reflow, laser reflow, or the like. Upon cooling, the solder alloy resolidifies and bonds to the surfaces to complete the connection. The solder connection not only physically attaches the component to the board, but also electrically connects the trace on the board and the contact of the component to conduct electrical current to and from the component for processing.

Tin-lead (Sn—Pb) alloys have been used for most electronic soldering operations. These alloys have been selected because of their mechanical strength, low relative cost, electrical conductivity and excellent wetting characteristics; wettability is an indication of how completely and quickly the molten solder can cover a solid surface. In addition, Sn—Pb alloys provide a low melting temperature, which is important in electronic applications because many components and printed circuit boards use materials that are easily damaged by exposure to high temperature during manufacture or assembly.

However, lead has been recognized as a health hazard, being toxic for workers and for the environment; recently governments have begun to urge the electronic industry to find alternatives to lead in order to reduce electronic industry worker lead exposure and reduce the amount of lead waste going back into the environment.

Lead presence in the soldering alloys is particularly critical in the case of application for manufacturing the most recent generation of C-MOS; in fact the details are so thin in this kind of board, that the emission of α particles from the emitting radioisotope present in the lead can provoke serious problems for the device.

Tin-Bismuth (Sn—Bi) solder alloys were investigated as alternatives to Sn—Pb solder alloys. Electrodeposition of such Sn—Bi alloys from different electrolytes and in particular from alkyl sulphonate baths is known in the art, as described in Surf. & Coat. Tech—Vol. 27, 151–166 (1986)—Y. N. Sadana, R. N. Gedye, S. Ali. Electrodeposition of Sn—Bi alloys onto a PCB with an alkyl sulphonate electrolyte is also described in U.S. Pat. No. 5,039,576.

A different lead-free solder alloy for microelectronic applications is described in EP-A 94108684.5. Such document discloses solder alloys containing more than 90% weight percent tin (Sn), and an effective amount of silver (Ag) and bismuth (Bi), optionally with Antimony (Sb) or with Sb and copper (Cu). Different methods for obtaining the described alloys, including electrodeposition, are mentioned.

Lead-free solder alloys known in the art present however some drawbacks. They exhibit poor soldering and metallurgical properties, that is small peel strength and low creep resistance. Particularly, they have shown poor mechanical properties at temperatures of the type typically encountered by microelectronic packages during use. A Sn—Bi alloy, for example, when electrodeposited onto copper of PCBs from alkylsulphonate or other electrolytes shows some difficulties related to the low wettability and stability.

SUMMARY OF THE INVENTION

It is an object of the present invention to provide a technique which alleviates the above drawbacks.

According to the present invention we provide an electrodeposition bath for electrodepositing a tin-bismuth (Sn—Bi) alloy onto a copper (Cu) substrate the bath comprising: zinc (Zn) salt.

Further, according to the present invention we provide a method for electrodepositing a tin-bismuth (Sn—Bi) solder alloy onto a copper substrate using an electrodeposition bath containing zinc (Zn) salt.

BRIEF DESCRIPTION OF THE DRAWING

FIG. 1 shows a graphic comparison of the potentiodynamic behaviour between a prior art electrodeposition bath and a bath according to a preferred embodiment of the present invention.

DETAILED DESCRIPTION OF THE PREFERRED EMBODIMENT

The method of the present invention is particularly useful in the manufacturing of electronic modules, when electronic components need to be soldered onto a Cu substrate. According to a preferred embodiment the Sn alloy is lead (Pb) free and is a tin-bismuth (Sn—Bi) alloy.

According to the preferred embodiment, for example in the manufacturing of a printed circuit board, the solder alloy is applied to a Cu substrate, typically onto the pad included in the printed circuit board; alternatively, the solder alloy could be deposited onto electrical contacts of the component to be joined with the Cu substrate, such as an integrated circuit chip. The board is immersed in the bath, spaced apart from a suitable counterelectrode (anode). An electrical current, is applied to the anode for cathodically reducing the salts in the bath (for example Si, Bi and Cu) to their respective metals and thereby deposit the desired solder alloy onto the board. The conductive substrate is kept immersed for a time sufficient to deposit e solder alloy coating of the desired thickness and composition upon the substrate. The substrate is subsequently withdrawn from the electroplating bath. The plated conductive substrate is thereafter washed thoroughly as quickly as possible, to minimize staining.

In the preferred embodiment of the present invention the bath solution includes an alkyl-sulfonate electrolyte, typically methane sulphonate, in an amount sufficient to inhibit precipitation of alloy components, that is to maintain stability of the bath.

The soluble components are present in the bath in amounts sufficient to deposit a solder alloy onto a conductive substrate.

The bath includes an anode, for example an inert anode formed of platinum-plated titanium, and a substrate cathode immersed in the electrolyte solution and an appropriate source of electrical energy for electrodepositing the solder alloy onto a conductive substrate. As a possible alternative, a soluble anode, well known in the art, could be used.

In the preferred embodiment there has been used a bath solution which is commercially available. It is produced by LeaRonal Inc., Freeport, N.Y., USA. The composition and the characteristics of the LeaRonal bath solution are as follows:

| | |
|---|---|
| Sn (as stannous methane sulphonate) g/l | 8 |
| Bi (as bismuth methane sulphonate) | 20 g/l |
| Methane sulphonic acid | 500 ml/l |
| Finish treatment additive | 60 ml/l |
| pH | 0.3 |
| Temperature | 20–40° C. |
| Current density | 0.5–4 A/dm$^2$ |

To the above solution is added Zn metasulphonate salt, with Zn content in the range 5–30 g/l, maintaining all the other parameters unchanged. With the above described baths it was possible to obtain by electrodeposition a thick deposit, of thickness greater than 50 micron, in reasonable times for the industrial application. The obtained deposit is of uniform and near eutectic composition, it showed a good wettability and had a good adherence to copper, which is important for the reflowing process.

The addition to the bath of zinc methanesulphonate has been proved to strongly influence the bath behaviour, although zinc was not discharged onto the cathodic surface. For example FIG. 1 reports the potentiodynamic behaviour, obtained with a potentiostat where the voltage was imposed between the working electrode and a reference electrode (and corrected to the Standard Hydrogen Electrode SHE), the scanning rate of the voltage was 0.5 mV/s, the temperature 25 C. The runs were made after deposition of the Sn—Bi alloy for 5 min. Three solutions were examined: the LeaRonal Sn—Bi without addition of Zn salt (curve 1); the same solution with addition of Zn metalsulphonate with Zn content of 5 g/l (curve 2); the same with Zn content of 30/g/l (curve 3). From a comparison of the curves it is possible to observe a decrease of the rest potential when Zn is added to the bath, a better behaviour at low cathodic current densities and an increase of the voltage at current densities at which electrodeposition is normally made.

Zinc is known to be harmful if present in the tin alloy, being preferentially oxidized and giving large quantities of dross when the solder is stirred. However according to the invention the zinc, while it is present in the bath solution, is not codeposited on the substrate together with Sn—Bi.

One of the main advantages provided by the presence of zinc salts in the electrodeposition bath is that the wettability of the solder alloy is greatly enhanced.

After the solder deposition process, the electrical leads of the circuitized substrate are then brought into contact with the contacts of the component, wherein at least one surface is coated with the electrodeposited solder alloy. While the substrate current leads and the component are maintained in contact, the solder alloy is heated to cause the solder alloy to melt and reflow; heating may be by vapor phase reflow, infrared reflow, laser reflow, or the like. The assembly is usually heated at a temperature greater than 140° C., and preferably greater than 160° C. Upon cooling, the solder alloy resolidifies and bonds to the surfaces to complete the connection. The solder connection not only physically attaches the component to the board, but also electrically connects the trace on the board and the contact of the component to conduct electrical current to and from the component for processing.

During laboratory tests a comparison has been made between the samples obtained from the original LeaRonal Sn—Bi solution and from the same with added zinc methane sulphonate with zinc content of 15 g/l, after 5 min of deposition time at 20 mA/cm$^2$, onto copper substrates, soldered at 250 C, in an industrial oven with $N_2$ atmosphere, by XPS-ESCA spectroscopy.

In the case of the Sn—Bi alloy electrodeposited from the bath without zinc, we observed a great quantity of oxygen at the surface (54%), that was maintained also in depth (hydrates or basic salts), as observed by depth profiling with sputtering.

At a depth of 0.045 micron a typical composition was:
Sn 47%, Bi 11%, O 42%;
at 0.09 micron the composition was:
Sn 52%, Bi 19%, O 30%;
at 0.135 micron:
Sn 63%, Bi 23%, O 14%.

In the case of the Sn—Bi alloy electrodeposited from the bath with zinc methanesulphonate (Zn 15 g/l), we observed a great quantity of oxygen only at the surface (46%), which decreased in depth, as observed by depth profiling with sputtering.

At a depth of 0.045 micron a typical composition was:
Sn 31%, Bi 65%, O 4%;
at 0.09 micron:
Sn 49%, Bi 48%, O 3%;
at 0.135 micron:
Sn 64%, Bi 33%, O 3%.

These figures show that the addition of zinc methanesulphonate to the electrodeposition bath caused a substantial decrease of hydrates or basic salt coprecipitation during SnBi alloy electrodeposition, increasing the deposit wettability and decreasing the oxidation at the surface of the Sn—Bi alloy after reflowing.

Also the mechanical properties of the soldered Sn—Bi alloy electrodeposited with a bath according to the present invention have been proved by laboratory tests to be significantly enhanced. For example the peel strength of the soldered joint was increased.

We claim:

1. An electrodeposition bath for electrodepositing a tin-bismuth alloy onto a copper substrate, said bath comprising:
   zinc salt;
   tin salt; and
   bismuth salt;
   wherein said zinc salt is present in an amount effective to increase wettability of the electrodeposited alloy and decrease oxidation at the surface of the electrodeposited alloy after solder reflow.

2. The electrodeposition bath of claim 1 wherein said zinc salt is zinc metasulphonate.

3. The electrodeposition bath of claim 2 wherein said zinc content is in the range of from about 5 g/l to about 30 g/l.

4. The electrodeposition bath of claim 3 wherein said zinc content is about 15 g/l.

5. The electrodeposition bath of claim 1 wherein said bath is lead-free.

6. A method for electrodepositing a tin-bismuth alloy onto a copper substrate comprising the steps of:

provide an electrodeposition bath containing zinc salt, tin salt, and bismuth salt;

providing a copper substrate; and electrodepositing a tin-bismuth alloy onto said copper substrate;

wherein said zinc salt is present in an amount effective to increase wettability of the electrodeposited alloy and decrease oxidation at the surface of the electrodeposited alloy after solder reflow.

7. The method of claim 6 wherein the current density applied during said electrodepositing is within the range of from about 0.5 A/dm$^2$ to about 4 A/dm$^2$.

8. The method of claim 7 wherein said zinc salt is zinc metalsulphonate.

9. The method of claim 8 wherein the zinc content is within the range of from about 5 g/l to about 30 g/l.

10. The method of claim 9 wherein said zinc content is about 15 g/l.

11. The method of claim 6 wherein said electrodeposition bath is lead-free during said electrodepositing of said tin-bismuth alloy onto said copper substrate.

12. A soldering method for soldering electronic components onto a copper substrate using a tin-bismuth solder alloy comprising the steps of:

electrodepositing said tin-bismuth solder alloy on said copper substrate using an electrodeposition bath containing zinc salt, tin salt, and bismuth salt;

bringing said electronic components in contact with said tin-bismuth solder alloy; and reflowing said tin-bismuth solder alloy to join said electronic components to said copper substrate;

wherein said zinc salt is present in an amount effective to increase wettability of the electrodeposited alloy and decrease oxidation at the surface of the electrodeposited alloy after solder reflow.

13. The soldering method of claim 12 wherein said electrodeposition bath is lead-free during said electrodepositing of said tin-bismuth solder alloy on said copper substrate.

\* \* \* \* \*